United States Patent [19]

Horikawa et al.

[11] Patent Number: 5,138,491
[45] Date of Patent: Aug. 11, 1992

[54] BEAM-COMBINING LASER BEAM SOURCE DEVICE

[75] Inventors: Kazuo Horikawa; Kouichi Okada; Ichirou Miyagawa, all of Kanagawa, Japan

[73] Assignee: Fuji Photo Film Co., Ltd., Kanagawa, Japan

[21] Appl. No.: 561,764

[22] Filed: Aug. 2, 1990

Related U.S. Application Data

[62] Division of Ser. No. 397,814, Aug. 24, 1989, Pat. No. 4,976,527.

[30] Foreign Application Priority Data

Aug. 26, 1988 [JP] Japan ................. 63-212234

[51] Int. Cl.⁵ .................... G02B 27/14; G02B 7/02
[52] U.S. Cl. ................... 359/622; 359/626; 359/627; 359/641; 372/34
[58] Field of Search .......... 350/169, 171, 174, 253, 350/588; 372/34, 43; 359/622, 626, 629, 630, 627, 636, 637, 641

[56] References Cited

U.S. PATENT DOCUMENTS

| | | | |
|---|---|---|---|
| 3,921,098 | 11/1975 | Hoag | 372/86 |
| 4,321,558 | 3/1982 | Zappa | 372/58 |
| 4,338,577 | 7/1982 | Sato et al. | 372/44 |
| 4,924,321 | 5/1990 | Miyagawa et al. | 350/6.7 |
| 4,976,527 | 12/1990 | Horikawa et al. | 350/174 |
| 4,978,197 | 12/1990 | Horikawa | 350/174 |
| 4,986,634 | 1/1991 | Horikawa et al. | 350/253 |

Primary Examiner—Bruce Y. Arnold
Assistant Examiner—R. D. Shafer
Attorney, Agent, or Firm—Sughrue, Mion, Zinn, Macpeak & Seas

[57] ABSTRACT

A beam-combining laser beam source device comprising an airtight housing and a laser beam source unit housed in the housing. The laser beam source unit comprises laser beam sources and collimator optical systems respectively positioned in optical paths of laser beams, which are radiated from the laser beam sources, in order to collimate the laser beams. Optical path adjusting elements are respectively positioned in the optical paths of the laser beams in order to radiate the laser beams along optical paths parallel and close to one another. The laser beam sources, the collimator optical systems, and the optical path adjusting elements are supported on a single support. The housing is provided with a temperature sensor, which detects the temperature in the housing, and temperature adjusting elements which heat or chill the housing on the basis of control of the temperature sensor so that the temperature in the housing is kept constant.

1 Claim, 4 Drawing Sheets

BEAM-COMBINING LASER BEAM SOURCE DEVICE

This is a divisional of application Ser. No. 07/397,814 filed Aug. 24, 1989 now U.S. Pat. No. 4,976,527.

BACKGROUND OF THE INVENTION

1. Field of the Invention

This invention generally relates to a beam-combining laser beam source device wherein laser beams produced by a plurality of laser beam sources, such as semiconductor lasers which have a low power output, are combined so as to multiply the power of the individual laser beam sources. This invention particularly relates to a beam-combining laser beam source device wherein a high accuracy of laser beam combination is kept consistent.

2. Description of the Prior Art

Light beam scanning apparatuses wherein a laser beam is deflected by a light deflector in order to scan a surface with the laser beam have heretofore been widely used in, for example, scanning recording apparatuses and scanning read-out apparatuses. In such light beam scanning apparatuses, it is desired that a plurality of laser beams be combined so as to obtain laser beams having a high intensity and that those laser beams having a high intensity be used as scanning light in order to, for example, increase the speed at which the information recorded on a surface to be scanned is recorded or read out. Combination of the laser beams is required particularly when semiconductor lasers are used as the laser beam sources. Specifically, a semiconductor laser has various advantages over a gas laser or the like in that the semiconductor laser is small in size, cheap and consumes little power, and that the laser beam can be modulated directly when the drive current applied to the semiconductor laser is changed.

However, the output power of the semiconductor laser is low (20 mW to 30 mW) when the semiconductor laser is operated in order to continuously radiate the laser beam. Therefore, the semiconductor laser is not suitable for use in a light beam scanning apparatus wherein scanning light having a high energy is necessary, for example: a scanning recording apparatus wherein information is recorded on a recording material which has a low sensitivity, such as a draw material (a metal film, an amorphous film, or the like).

On the other hand, when certain kinds of phosphors are exposed to radiation such as X-rays, α-rays, β-rays, γ-rays, cathode rays or ultraviolet rays, they store part of the energy of the radiation. Then, when the phosphor which has been exposed to the radiation is exposed to stimulating rays such as visible light, light is emitted by the phosphor in proportion to the amount of energy stored during exposure to the radiation. A phosphor exhibiting such properties is referred to as a stimulable phosphor. In U.S. Pat. Nos. 4,258,264, 4,276,473, 4,315,318 and 4,387,428 and Japanese Unexamined Patent Publication No. 56(1981)-11395, use of a stimulable phosphor in a radiation image recording and reproducing system was proposed. Specifically, a sheet provided with a layer of the stimulable phosphor (hereinafter referred to as a stimulable phosphor sheet) is first exposed to radiation which has passed through an object such as the human body in order to store a radiation image of the object thereon, and is then scanned with a stimulating ray such as a laser beam which cause it to emit light in proportion to the amount of energy stored during exposure to the radiation. The light emitted by the stimulable phosphor sheet upon stimulation thereof is photoelectrically detected and converted into an electric image signal, and the image signal is used to reproduce the radiation image of the object as a visible image on a recording material such as photographic film, a display device such as a cathode ray tube (CRT), or the like.

In the aforesaid radiation image recording and reproducing system, it is desired to use a light beam scanning apparatus, wherein a semiconductor laser is used, in order to scan the stimulable phosphor sheet on which a radiation image has been stored, thereby to read out the radiation image. However, in order to quickly read out the radiation image from the stimulable phosphor sheet, it is necessary to irradiate stimulating rays which have a sufficiently high energy onto the stimulable phosphor sheet. Accordingly, it is not always possible to use a light beam scanning apparatus, wherein a semiconductor laser is used, in order to read out an image in the radiation image recording and reproducing system.

In order to obtain a scanning laser beam having a sufficiently high energy from a semiconductor laser, or the similar lasers, having a low power outputs, a plurality of laser beam sources may be used, and laser beams radiated from the laser beam sources may be combined so as to multiply the power of the individual laser beam sources.

In general, in order to combine the laser beams produced by a plurality of laser beam sources, the laser beams produced by the laser beam sources are collimated respectively by collimator lenses, guided along optical paths parallel and close to one another, and converged to a common spot by a converging lens. For example, in Japanese Patent Application No. 63(1988)-35836 a beam-combining laser beam source unit is provided with a plurality of laser beam sources and which efficiently combines laser beams. The proposed laser beam source unit comprises a plurality of laser beam sources, collimator optical systems positioned in optical paths of laser beams, which are radiated from the laser beam sources, in order to collimate the laser beams, and optical path adjusting elements respectively positioned in the optical paths of the laser beams in order to radiate the laser beams along optical paths parallel and close to one another. The laser beam sources, the collimator optical systems, and the optical path adjusting elements are supported on a single support means. With the proposed laser beam source unit, when the laser beams radiated from the laser beam source unit are caused to impinge upon a converging lens, the laser beams can be converged to a single spot at a desired position.

In order to accurately combine the laser beams in the laser beam source unit described above, it is necessary to accurately adjust the positions of the optical elements of the laser beam source unit so that the laser beams radiated from the laser beam source unit are collimated and follow predetermined optical paths which are parallel to one another. For this purpose, it is necessary to adjust the temperature of the whole laser beam source unit so that it is uniform. Specifically, if the temperature of the laser beam source unit were not uniform, the holding means would be deformed, and therefore the accuracy of the positions of the collimator optical systems and the optical path adjusting elements would become deteriorated. As a result, the condition in which the laser beams are radiated from the laser beam source unit varies, and the laser beams cannot be combined accurately at a predetermined position. For example, in cases where the laser beam source unit is used as a means to generate scanning light which is used to read out or reproduce a radiation image in the radiation image recording and reproducing system described above, scanning light comprising the laser beams combined in a desirable manner could not be obtained if a temperature difference on the order of approximately 1° C. arose with the laser beam source unit.

In order to make the temperature of the laser beam source unit uniform, providing the laser beam source unit with heaters and a temperature sensor, and to control the operations of the heaters based on the detection of the temperature sensor so that the temperature of the laser beam source unit is kept at a constant value (for example, 48° C.) are considered.

However, in general, the temperature of ambient air around the laser beam source unit which is being operated is lower than the temperature of the laser beam source unit. Therefore, in cases where the laser beam source unit is located so that it is in contact with ambient air, even though the temperature of the laser beam source unit is controlled in the manner described above, the laser beam source unit is cooled by the ambient air, so that the temperature of the laser beam source unit in positions close to the heaters and positions remote therefrom.

SUMMARY OF THE INVENTION

The primary object of the present invention is to provide a beam-combining laser beam source device wherein the temperature of a laser beam source unit is kept uniform without being adversely affected by ambient air.

Another object of the present invention is to provide a beam-combining laser beam source device wherein a high accuracy of laser beam combination is kept consistent.

The present invention provides a first beam-combining laser beam source device which comprises:
i) an airtight housing, and
ii) a laser beam source unit which is housed in said housing and which comprises:
a) a plurality of laser beam sources,
b) collimator optical systems respectively positioned in optical paths of laser beams, which are radiated from the laser beam sources, in order to collimate the laser beams,
c) optical path adjusting elements respectively positioned in the optical paths of the laser beams in order to radiate the laser beams along optical paths parallel and close to one another, and
d) a support means which supports said laser beam sources, said collimator optical systems and said optical path adjusting elements,
wherein said housing is provided with a temperature sensor, which detects the temperature in said housing, and temperature adjusting elements which heat or chill said housing on the basis of control of said temperature sensor, so that the temperature in said housing is kept constant.

With the first beam-combining laser beam source device in accordance with the present invention, the laser beam source unit is housed in the housing, and the temperature in the housing is adjusted so that it is kept constant regardless of the temperature of ambient air. Therefore, the temperature of the laser beam source unit housed in the housing can be kept at a predetermined value without being adversely affected by ambient air. The laser beam source unit may be provided with a temperature adjusting means which is independent from the temperature sensor and the temperature adjusting elements of the housing, and which adjusts the temperature of the laser beam source unit when the operation of the beam-combining laser beam source device is begun.

The present invention also provides a second beam-combining laser beam source device which comprises:
i) an airtight housing,
ii) a laser beam source unit which is housed in said housing and which comprises:
a) a plurality of laser beam sources,
b) collimator optical systems respectively positioned in optical paths of laser beams, which are radiated from the laser beam sources, in order to collimate the laser beams,
c) optical path adjusting elements respectively positioned in the optical paths of the laser beams in order to radiate the laser beams along optical paths parallel and close to one another, and
d) a support means which supports said laser beam sources, said collimator optical systems, and said optical path adjusting elements,
iii) a temperature sensor which detects the temperature of said laser beam source unit, and
iv) at least one heating means which is secured to said housing and which radiates heat to said laser beam source unit on the basis of control of said temperature sensor so that the temperature of said laser beam source unit is kept constant.

With the second beam-combining laser beam source device in accordance with the present invention, the laser beam source unit is housed in the housing, and is positively heated by the heating means, which is secured to the housing, so that the temperature of the laser beam source unit is kept constant. Therefore, the adverse effects of the ambient air do not cause the temperature of the laser beam source unit to fluctuate. The term "heating means" as used herein means a means which heats the laser beam source unit so that the temperature thereof is kept higher than the temperature of the ambient air.

The present invention further provides a third beam-combining laser beam source device which comprises:
i) an airtight housing,
ii) a laser beam source unit which is housed in said housing and which comprises:
a) a plurality of laser beam sources,
b) collimator optical systems respectively positioned in optical paths of laser beams, which are radiated from the laser beam sources in order to collimate the laser beams,
c) optical path adjusting elements respectively positioned in the optical paths of the laser beams in order to radiate the laser beams along optical paths parallel and close to one another, and
d) a support means which supports said laser beam sources, said collimator optical systems and said optical path adjusting elements,
wherein the pressure in said housing is not higher than 0.5 atm.

Part of heat transfer between the laser beam source unit and ambient air is effected by convection of air around the laser beam source unit. With the third beam-combining laser beam source device in accordance with the present invention wherein the pressure around the laser beam source unit is reduced, it is possible to prevent convection and to minimize release of heat from the laser beam source unit.

The present invention still further provides a fourth beam-combining laser beam source device which comprises:

i) an airtight housing,
ii) a laser beam source unit which is housed in said housing and which comprises:
a) a plurality of laser beam sources,
b) collimator optical systems respectively positioned in optical paths of laser beams, which are radiated from the laser beam sources in order to collimate the laser beams,
c) optical path adjusting elements respectively positioned in the optical paths of the laser beams in order to radiate the laser beams along optical paths parallel and close to one another, and
d) a support means which supports said laser beam sources, said collimator optical systems and said optical path adjusting elements, wherein the emissivity of the outer surface of said support means is not larger than 0.5, and/or the emissivity of the inner surface of said housing is not larger than 0.5.

With the fourth beam-combining laser beam source device in accordance with the present invention, the emissivity of the outer surface of the support means and/or the emissivity of the inner surface of the housing is restricted to a value not larger than 0.5. Therefore, it is possible to prevent heat emission from the laser beam source unit through the housing to the exterior, thereby to prevent the laser beam source unit from being chilled by ambient air. In cases where the emissivity of the inner surface of the housing is restricted to a value not larger than 0.5, the inner surface outside of the part of the housing through which laser beams pass is treated so that it has a desired emissivity.

As described above, with the first to fourth beam-combining laser beam source devices in accordance with the present invention, it is possible to prevent the laser beam source unit from being chilled by ambient air. Therefore, it is possible to eliminate the problem of the temperature of the laser beam source unit becoming nonuniform and the accuracy of the positions of the optical elements of the laser beam source unit becoming deteriorated. Accordingly, a high accuracy of laser beam combination can be kept consistent.

DESCRIPTION OF THE PREFERRED EMBODIMENTS

The present invention will hereinbelow be described in further detail with reference to the accompanying drawings.

Figure 1:
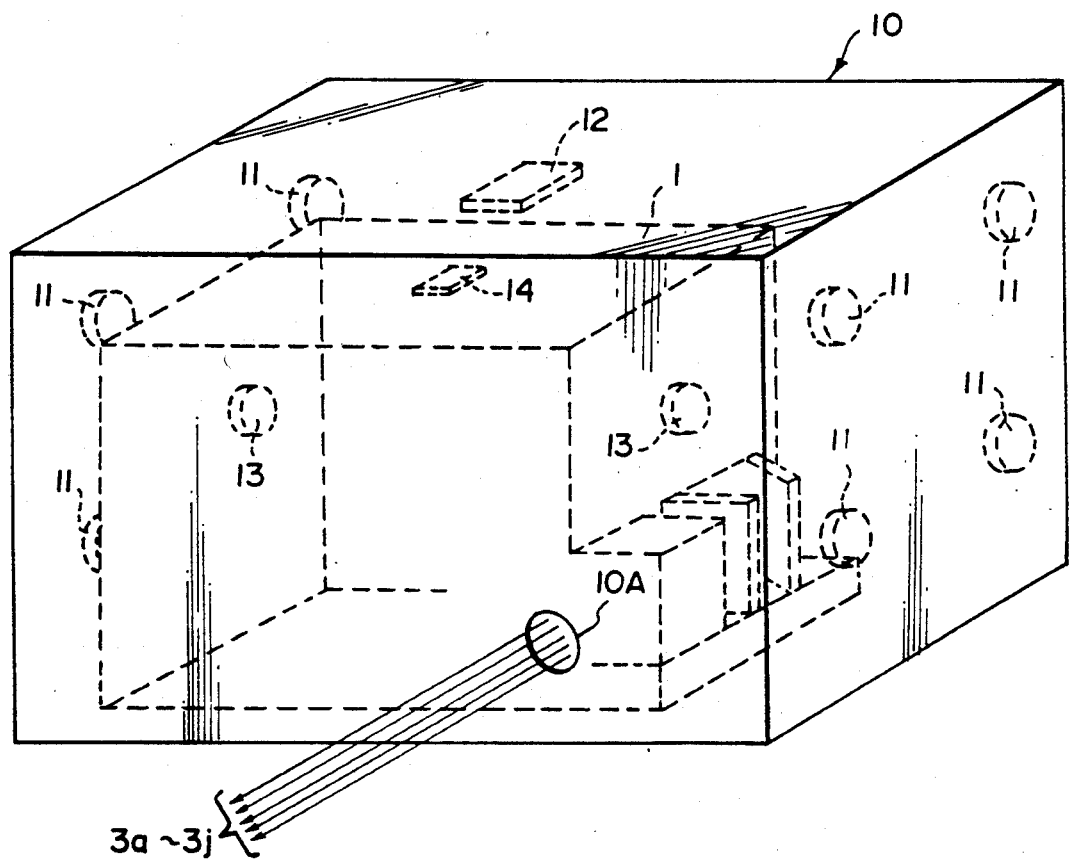
FIG. 1 is a perspective view showing an embodiment of the beam-combining laser beam source device in accordance with the present invention.

With reference to FIG. 1, an embodiment of the beam-combining laser beam source device in accordance with the present invention comprises an airtight housing 10 constituted of a metal material or the like, and a laser beam source unit 1 which is housed in the housing 10 and which is provided with a plurality of semiconductor lasers. A plurality of laser beams radiated from the laser beam source unit 1 along optical paths parallel and close to one another are radiated through an emission window 10A to the area outside of the housing 10. The configuration of the laser beam source unit 1 will be described hereinbelow with reference to FIG. 2.

The laser beam source unit 1 comprises, by way of example, ten semiconductor lasers 3A, 3B, 3C, 3D, 3E, 3F, 3G, 3H, 3I and 3J which are positioned in two rows and secured to an upper plate 2A of support means 2 so that their axes of laser beam emission are parallel one another. A pair of middle plates 2B, 2B are secured to the middle portion of a wall member 2D which supports the upper plate 2A. Ten concave lenses 4, 4, ... are secured to the middle plates 2B, 2B, five lenses on each plate, so that they face the semiconductor lasers 3A through 3J. Also, a pair of mirror holding plates 2G, 2G (only one of the plates is shown) are secured to the lower portion of the wall member 2D. Ten reflecting mirrors 5, 5, ... which act as optical path adjusting elements are secured to the mirror holding plates 2G, 2G, five mirrors on each plate, so that the reflecting mirrors 5, 5, ... face the concave lenses 4, 4, ... The semiconductor lasers 3A through 3J, the concave lenses 4, 4, ... and the reflecting mirrors 5, 5, ... are positioned symmetrically with respect to the wall member 2D. A first side plate 2E is secured to one side of the wall member 2D, and a second side plate 2F which supports a polarization beam splitter and a halfwave plate, which will be described later, is secured to the other side of the wall member 2D. Also, a lower plate 2C is secured to the bottom face of the wall member 2D. In the laser beam source unit 1 of this embodiment, the support means 2 is constituted of the upper plate 2A, the middle plate 2B, the lower plate 2C, the wall member 2D, the first side plate 2E, the second side plate 2F, and the mirror holding plates 2G, 2G.

Figure 2:
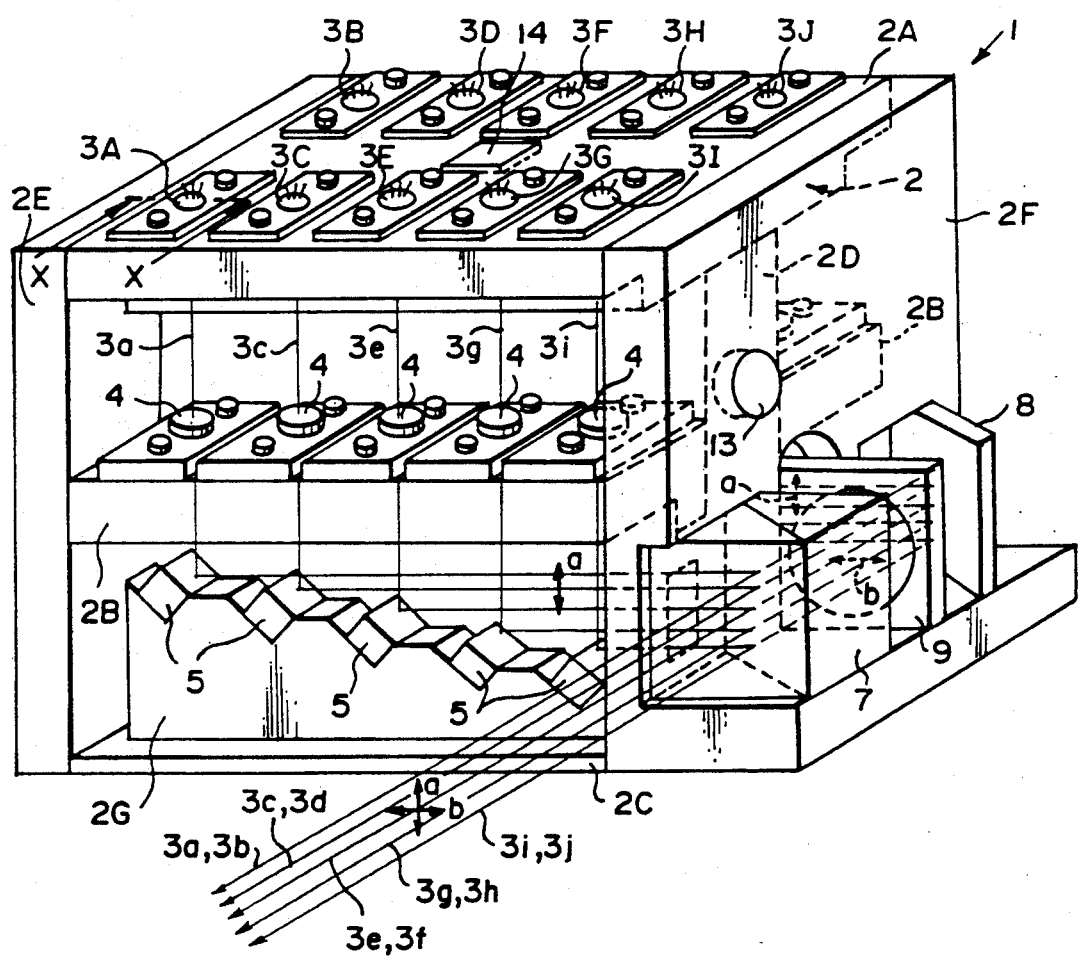
FIG. 2 is a perspective view showing the laser beam source unit in the embodiment of FIG. 1.
Figure 3:
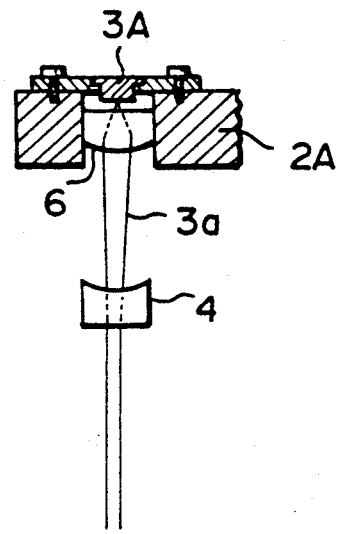
FIG. 3 is a sectional view taken along line X—X in FIG. 1.

Convex lenses 6, 6, ... (not shown in FIG. 2) are provided inside of the upper plate 2A so that they face the semiconductor lasers 3A through 3J. (By way of example, FIG. 3 shows the convex lens 6 facing the semiconductor laser 3A.) In this laser beam source unit 1, a collimator optical system is constituted of the concave lens 4 and the convex lens 6. As shown in FIG. 3, a laser beam 3a produced by the semiconductor laser 3A is passed through and collimated by the collimator optical system. In the same manner, laser beams 3b through 3j produced by the semiconductor lasers 3B through 3J are collimated by corresponding collimator optical systems provided in the optical paths of the laser beams 3b through 3j.

The laser beams 3a, 3c, 3e, 3g and 3i after being collimated are reflected by the reflecting mirrors 5, 5, ... provided therebelow, and impinge upon a polarization beam splitter 7. The semiconductor lasers 3A, 3C, 3E, 3G and 3I are positioned so as to radiate the laser beams 3a, 3c, 3e, 3g and 3i in a single plane. Also, the reflecting mirrors 5, 5, . . . provided in the optical paths of the laser beams 3a, 3c, 3e, 3g and 3i are held by the mirror holding plate 2G, which has a step-like upper face, so that they are vertically deviated little by little from one another as shown in FIG. 2. Therefore, the positions from which the laser beams 3a, 3c, 3e, 3g and 3i are reflected by the reflecting mirrors 5, 5, . . . vary little by little only in the vertical direction, and the laser beams 3a, 3c, 3e, 3g and 3i after being reflected by the reflecting mirrors 5, 5, . . . follow optical paths which are parallel and very close to one another in the vertical direction. Also, on the rear side of the wall member 2D, laser beams 3b, 3d, 3f, 3h and 3j, produced by the semiconductor lasers 3B, 3D, 3F, 3H and 3J, are reflected by the reflecting mirrors 5, 5, . . . and then follow optical paths which are parallel and very close to one another in the vertical direction. As for the laser beams produced by each pair of the semiconductor lasers provided facing each other with the wall member 2D intervening therebetween (i.e. the laser beams 3a and 3b, the laser beams 3c and 3d, and so on), the heights of the respective pairs of laser beams are equal to each other after the laser beams are reflected by corresponding reflecting mirrors 5, 5. Furthermore, the semiconductor lasers 3A through 3J are secured to the upper plate 2A so that the directions of polarization of the laser beams 3a through 3j, after being reflected by the reflecting mirrors 5, 5, . . . , are the same (i.e. the direction coincides with the direction indicated by the arrow "a" in FIG. 2). The second side plate 2F is provided with openings through which the laser beams 3a through 3j, after being reflected by the reflecting mirrors 5, 5, . . . pass.

Figure 4:
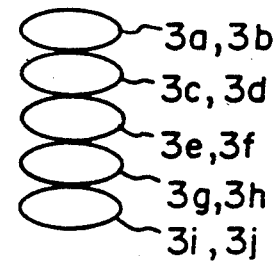
FIG. 4 is a schematic view showing cross-sections of laser beams radiated from the laser beam source unit shown in FIG. 2, and FIGS. 5, 6 and 7 are schematic views showing further embodiments of the beam-combining laser beam source device in accordance with the present invention.

The polarization beam splitter 7 reflects light polarized in the direction indicated by the arrow "a". Therefore, the laser beams 3a, 3c, 3e, 3g and 3i are reflected by the polarization beam splitter 7. On the other hand, the laser beams 3b, 3d, 3f, 3h and 3j are reflected by a mirror 8 so that the directions of their optical paths are changed by an angle of approximately 90°. Then, the laser beams 3b, 3d, 3f, 3h and 3j are passed through a halfwave plate 9 so that the direction of polarization is changed by an angle of 90°, and the laser beams 3b, 3d, 3f, 3h and 3j are converted to light polarized in the direction indicated by the arrow "b". The polarization beam splitter 7 transmits light polarized in the direction indicated by the arrow "b". Therefore, the laser beams 3b, 3d, 3f, 3h and 3j after being polarized in the direction indicated by the arrow "b", pass through the polarization beam splitter 7. The laser beam 3b is radiated along the same optical path as the laser beam 3a, and the laser beam 3d is radiated along the same optical path as the laser beam 3c. Also, the laser beam 3f is radiated along the same optical path as the laser beam 3e, the laser beam 3h is radiated along the same optical path as the laser beam 3g, and the laser beam 3j is radiated along the same optical path as the laser beam 3i. FIG. 4 shows cross-sections of the laser beams 3a through 3j radiated along the optical paths parallel and close to one another.

Reverting to FIG. 1, the housing 10 of the beam-combining laser beam source device is provided with the emission window 10A through which the laser beams 3a through 3j produced by the laser beam source unit 1 are radiated to the area outside of the housing 10. The emission window 10A should preferably be subjected to antireflection coating, and/or inclined with respect to the incident laser beams 3a through 3j so that no light is reflected by the emission window to the semiconductor lasers and causes noise.

In this embodiment, the housing 10 is provided with a plurality of heaters 11, 11, . . . , which act as temperature adjusting elements, and a temperature sensor 12, which keeps the temperature of the whole laser beam source unit 1 constant. The heaters 11, 11, . . . are embedded in the walls of the housing 10 in order to uniformly heat the whole area inside of the housing 10. The temperature in the housing 10 heated by the heaters 11, 11, . . . is detected by the temperature sensor 12. The temperature sensor 12 turns off the heaters 11, 11, . . . when the detected value is higher than a predetermined temperature, and turns on the heaters 11, 11, . . . when the detected value is lower than the predetermined value. The predetermined temperature should be set so that the temperature in the housing 10 is kept higher than the ambient temperature at the location of the beam-combining laser beam source device regardless of fluctuations of the ambient temperature. Because the laser beam source unit 1 is housed in the airtight housing 10 and the temperature in the housing 10 is kept constant, the temperature of the laser beam source unit 1 can be kept constant without being lowered by the ambient air, and can be prevented from varying between different parts of the laser beam source unit 1. In this embodiment, as shown in FIG. 2, heaters 13, 13 are mounted on the side plates 2E and 2F of the laser beam source unit 1, one heater on each side plate. (Only the heater 13 on the side plate 2F is shown in FIG. 2.) Also, a temperature sensor 14 is mounted on the upper plate 2A in order to directly adjust the temperature of the laser beam source unit 1 when the operation of the beam-combining laser beam source device is begun. Specifically, when the operation of the beam-combining laser beam source device is begun, the laser beam source unit 1 is directly heated by the heaters 13, 13 in order to quickly raise the temperature of the laser beam source unit 1 to approximately the predetermined temperature at which the temperature in the housing 10 is to be kept by heating of the heaters 11, 11, . . . in the housing 10. Therefore, the time required to start the operation of the beam-combining laser beam source device can be shortened. In cases where the operation of the beam-combining laser beam source device need not be started so quickly, the heaters 13, 13 and the temperature sensor 14 of the laser beam source unit 1 may be omitted. Also, in cases where the ambient temperature around the beam-combining laser beam source device is very high and exceeds the set temperature of the housing 10, instead of the heaters 11, 11, . . . , cooling elements may be provided as the temperature adjusting elements of the housing 10 in order to keep the temperature in the housing 10 at a value lower than the ambient temperature.

Another embodiment of the beam-combining laser beam source device in accordance with the present invention will be described hereinbelow with reference to FIG. 5.

Figure 5:
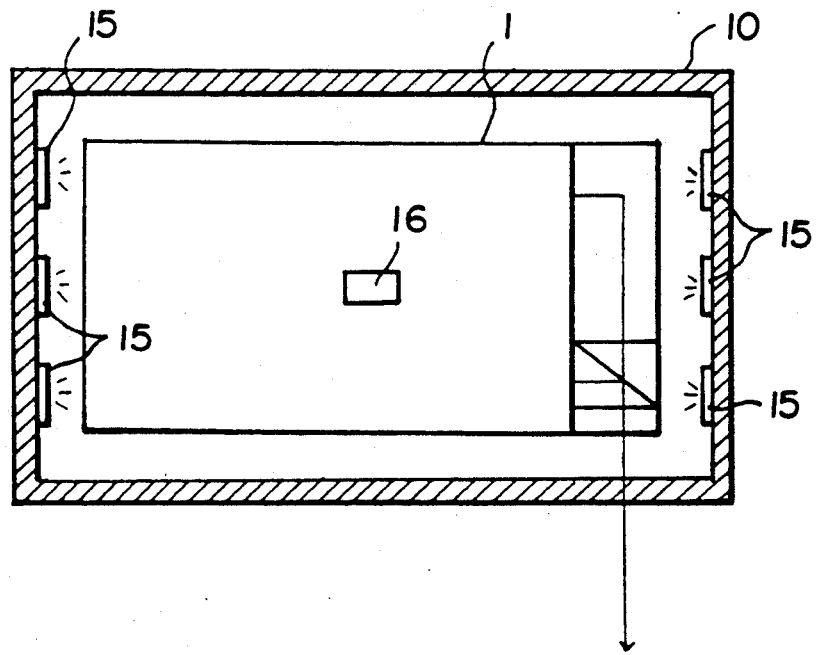

The beam-combining laser beam source device shown in FIG. 5 comprises heat radiating means 15, 15, . . . , which are mounted on, by way of example, the inner side surface of the housing 10 in order to radiate heat to the inward side of the housing 10, and a temperature sensor 16 which is mounted on the laser beam source unit 1. The heat radiating means 15, 15, . . . heat the laser beam source unit 1 so that the laser beam source unit 1 is kept at a predetermined temperature which is higher than the ambient temperature. The temperature sensor 16 detects the temperature of the laser beam source unit 1 and turns the heat radiating means 15, 15, on and off . . . so that the detected temperature becomes constant. The temperature sensor 16 may directly or indirectly detect the temperature of the laser beam source unit 1, and need not necessarily be mounted on the laser beam source unit 1. Any number of heat radiating means 15, 15, . . . may be located at arbitrary positions on the inner surface of the housing 10 insofar as they can radiate heat to the whole area of the laser beam source unit 1.

In the two embodiments described above, the support means 2 of the laser beam source unit 1 should preferably be constituted of a material such as metal which has a high thermal conductivity.

Figure 6:
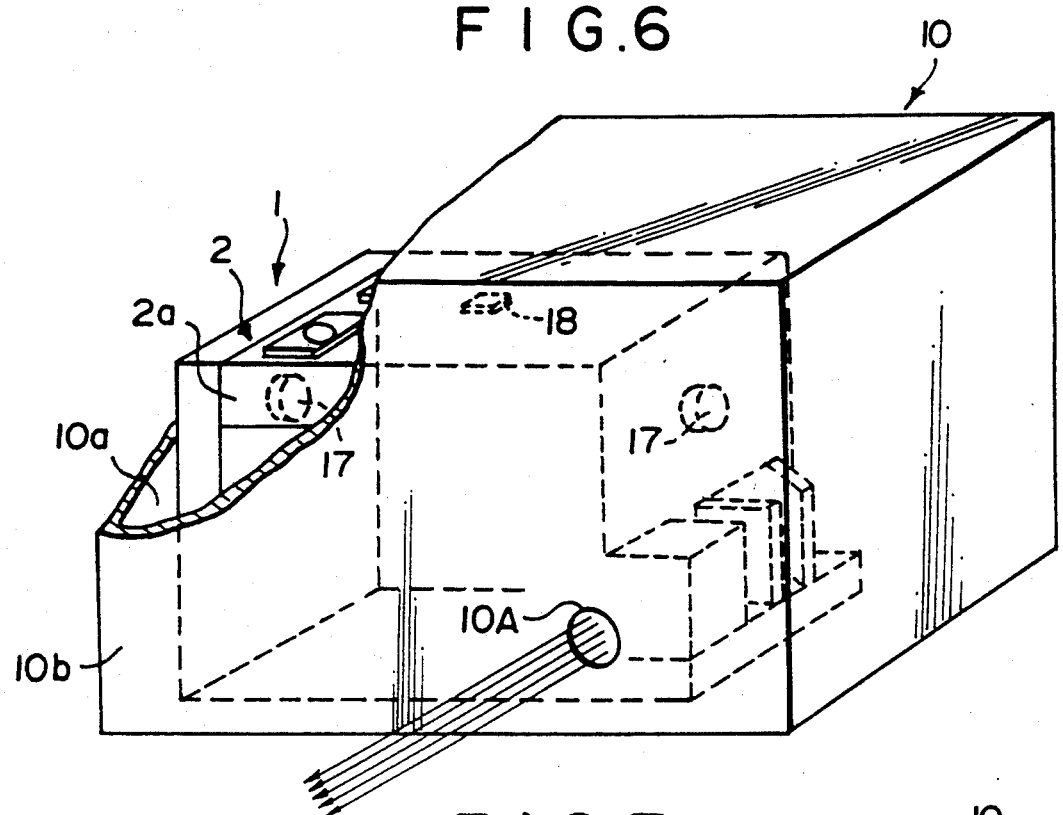

A further embodiment of the beam-combining laser beam source device in accordance with the present invention will be described hereinbelow with reference to FIG. 6. This embodiment is constituted to prevent heat from escaping by radiation from the beam-combining laser beam source device to the ambient air. Specifically, the temperature of the laser beam source unit 1 is kept constant by heaters 17, 17 and a temperature sensor 18, which are mounted on the laser beam source unit 1. Also, an outer surface 2a of the support means 2 of the laser beam source unit 1 and an inner surface 10a of the housing 10 are treated so that the surfaces 2a and 10a have emissivities not larger than 0.5. For example, in order to form the surfaces 2a and 10a having emissivities not larger than 0.5, the support means 2 and the housing 10 are constituted of a metal such as duralumin, and their surfaces are planished. The surfaces of the optical elements of the laser beam source unit 1, other than the parts through which the laser beams pass, may also be treated in the same manner as the outer surface 2a of the support means 2 so that the emissivities of said surfaces are not larger than 0.5. Furthermore, an outer surface 10b of the housing 10 may be treated in the same manner as the inner surface 10a so that the outer surface 10b has an emissivity not larger than 0.5. With this embodiment, because the outer surface of the laser beam source unit 1 and the inner surface of the housing 10 has emissivities not larger than 0.5, heat of the laser beam source unit 1 does not readily escape from the laser beam source unit 1 or the housing 10 to the outward side of the beam-combining laser beam source device. Therefore, the temperature of the laser beam source unit 1 can be kept constant Alternatively, either one of the outer surface of the laser beam source unit 1 or the inner surface of the housing 10 may have an emissivity not larger than 0.5.

Figure 7:
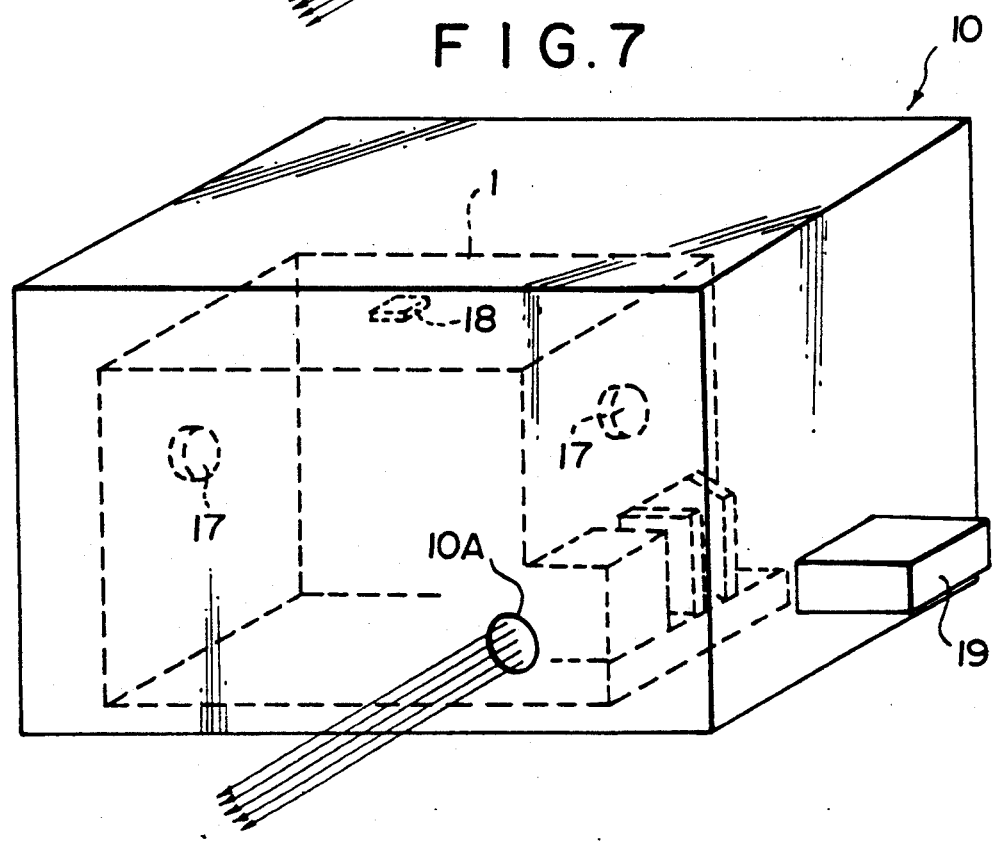

A still further embodiment of the beam-combining laser beam source device in accordance with the present invention will be described hereinbelow with reference to FIG. 7. In this embodiment, a suction means 19 is connected to the housing 10 in order to evacuate the housing 10 so that the pressure therein is kept at a value not larger than 0.5 atm. Because the pressure in the housing 10 is kept low, air convection is prevented from arising in the housing 10 when the temperature of the laser beam source unit 1 is adjusted to a high value by the heaters 17, 17 and the temperature sensor 18, which are mounted on the laser beam source unit 1. Therefore, it is possible to prevent heat from escaping through convection to the outward side of the beam-combining laser beam source device. Also, when air convection in the housing 10 is minimized, it is possible to eliminate the problem of the positions of the laser beams fluctuating due to sway of air. Evacuation of the housing 10 in accordance with this embodiment may be combined with the embodiments shown in FIGS. 1, 5 and 6.

We claim:

1. A beam-combining laser beam source device which comprises:
   i) an airtight housing having a predetermined pressure therein,
   ii) a laser beam source unit which is housed in said housing and which comprises:
      a) a plurality of laser beam sources,
      b) an optical collimator system respectively positioned in the optical path of each laser beam in order to collimate the laser beams,
      c) optical path adjusting elements, each respectively positioned in the optical path of the collimated laser beams, in order to radiate the laser beams along optical paths which are parallel and spaced a predetermined distance apart from one another, and
      d) a support means which supports said laser beam sources, said optical collimator system, and said optical path adjusting elements,
   wherein the predetermined pressure in said housing is not higher than 0.5 atm.

* * * * *